(12) United States Patent
Shen

(10) Patent No.: US 7,399,996 B2
(45) Date of Patent: Jul. 15, 2008

(54) LED PACKAGE AND METHOD FOR PRODUCING THE SAME

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 0 days.

(21) Appl. No.: 11/808,592

(22) Filed: Jun. 12, 2007

(65) Prior Publication Data
US 2007/0241358 A1 Oct. 18, 2007

Related U.S. Application Data

(62) Division of application No. 11/140,900, filed on Jun. 1, 2005, now abandoned.

(30) Foreign Application Priority Data
Jun. 3, 2004 (TW) .............................. 93115889 A

(51) Int. Cl.
*H01L 33/00* (2006.01)
(52) U.S. Cl. .................... 257/98; 257/99; 257/100; 257/E33.068; 257/748; 438/29; 438/33

(58) Field of Classification Search .................... 257/98, 257/E33.068
See application file for complete search history.

(56) References Cited

U.S. PATENT DOCUMENTS

| 6,660,550 | B2 * | 12/2003 | Sato ............................. 438/34 |
| 2005/0194605 | A1 * | 9/2005 | Shelton et al. ................ 257/99 |

\* cited by examiner

*Primary Examiner*—Tu-Tu V Ho
(74) *Attorney, Agent, or Firm*—Rosenberg, Klein & Lee

(57) ABSTRACT

An LED package and method for producing the same are described. The LED package has an LED die with a conductive region-forming surface and a plurality of conductive regions disposed on the conductive region-forming surface. An insulation layer is formed on the conductive region-forming surface of the LED die, and has a plurality of openings corresponding to the conductive regions, respectively. A conductive member fills a respective opening, and is electrically connected a respective conductive regions to an exterior circuit.

10 Claims, 10 Drawing Sheets

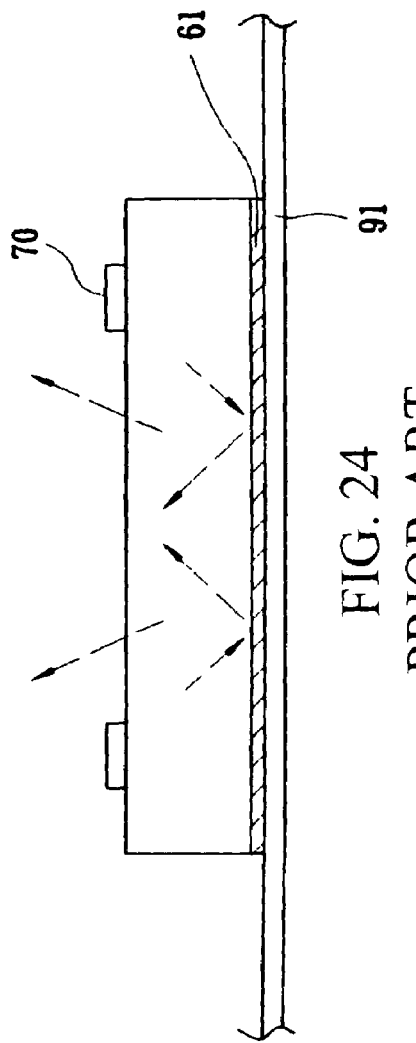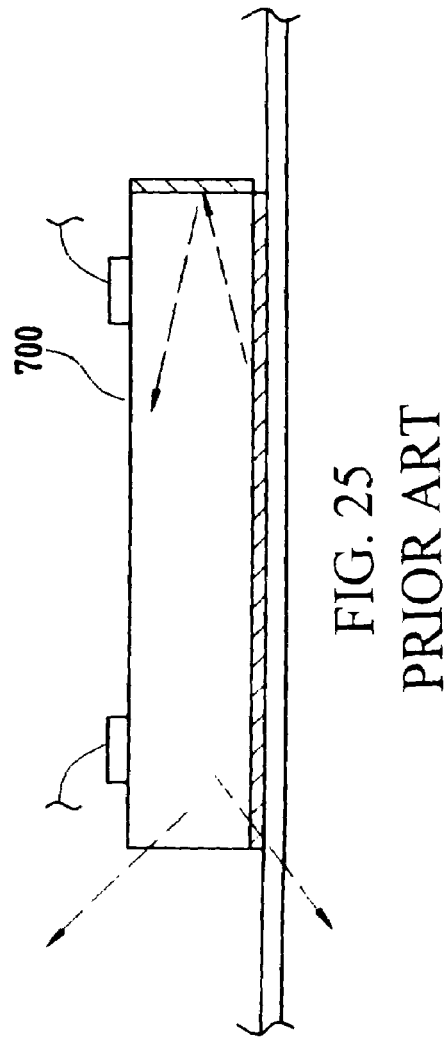

US 7,399,996 B2

LED PACKAGE AND METHOD FOR PRODUCING THE SAME

RELATED APPLICATIONS

This application is a Divisional patent application of application Ser. No. 11/140,900, filed on 1 Jun. 2005 now abandoned.

BACKGROUND OF THE INVENTION

1. Field of the Invention

The present invention relates to an LED package and method for producing the same, and particularly relates to a package and a method for a semiconductor wafer with high illumination and high mass production.

2. Background of the Invention

With respect to FIG. 26, a perspective view of a conventional LED package including a LED die 90 is illustrated. The LED die 90 has a conductive region-forming surface 900 that is also a main light emission surface, and two conductive regions 901 disposed on the conductive region-forming surface 900. The LED die 90 has an opposed surface opposite to the conductive region-forming surface 900. The LED die 90 is connected to a die-installation surface 910 of a substrate 91 via the opposed surface thereof. The conventional LED package further includes two connection members 92 corresponding to the two conductive regions 901, respectively. Each connection member 92 extends from the die-installation surface 910 to a predetermined portion of a backside surface opposite the die-installation surface 910. The predetermined portion of the die-installation surface 910 is used to connect electrically an exterior component (not shown). Each conductive region 901 of the LED die 90 is electrically connected to the corresponding connection member 92 via a bonding wire 93. A protection layer is further provided to cover the LED die 90 and the bonding wire 93 on the die-installation surface 910 of the substrate 91. The protection layer 94 is made of transparent resin materials.

However, there are some disadvantages in the conventional LED package mentioned above. First, a wafer (not shown) is diced into plural dies 90, and the dies 90 are disposed on respective substrates 91 in turn. The bonding wire 93 is applied for electrical connection. After the protection layer 94 is formed, the conventional LED package is finished. Therefore, the period of manufacturing the same is too long to fabricate by mass production.

Second, light toward the opposed surface of the LED die 90, shown as dotted lines, is only partially usable, and the remaining light, shown as solid lines, is useless and wasted. Thus, the total amount of light emitted through the main light emission surface 900 of the LED die 90, shown as dotted lines, is reduced, thereby, illumination of that type conventional LED package cannot be improved effectively.

SUMMARY OF INVENTION

An LED package and method for producing the same are disclosed for high mass production and high illumination.

An LED package includes an LED die, an insulation layer and a conductive member. The LED die has a conductive region-forming surface and a plurality of conductive regions disposed on the conductive region-forming surface. The insulation layer is formed on the conductive region-forming surface of the LED die, and has a plurality of openings corresponding to the conductive regions, respectively. The conductive member fills one of the openings, and electrically connects one respective pad to an exterior circuit.

An LED package includes an LED die, a first insulation layer, a metallic reflection layer, a second insulation later, and a conductive member. The LED die has a conductive region-forming surface and a plurality of conductive regions disposed on the conductive region-forming surface. The first insulation layer is formed on the conductive region-forming surface of the LED die, and has a plurality of channels corresponding to the conductive regions, respectively. The metallic reflection layer is formed on the first insulation layer, and has a plurality of through holes corresponding to the channels, respectively. The second insulation later is formed on the metallic reflection layer, and has a plurality of openings corresponding to the conductive regions via the channels and the through holes, respectively. The conductive member fills one of the openings, and electrically connects one of the conductive regions to an exterior circuit.

An LED package includes an LED die, a reflection layer, a substrate, a binding wire and a protection layer. The LED die has a conductive region-forming surface and a plurality of conductive regions disposed on the conductive region-forming surface. The reflection layer is formed on an opposed surface of the LED die, opposite the conductive region-forming surface. The substrate has a die-installation surface on which the LED die is disposed via the reflection layer. The substrate includes a plurality of connection members in accordance with the conductive regions for electrical connection, respectively, and each connection member extends from the die-installation surface to a predetermined portion of a back surface of the substrate, opposite the die-installation surface, for electrically connecting to an exterior circuit. The binding wire connects one of the conductive regions and a corresponding connection member. The protection layer covers the substrate for enclosing the LED die and the binding wire.

A method for producing an LED package includes the following steps. (a) An LED wafer, which includes a plurality of LED sections. Each LED section includes a conductive region-forming surface and a plurality of conductive regions disposed on the conductive region-forming surface. (b) An insulation layer is formed on the conductive region-forming surface of each LED section, and the insulation layer is patterned with a plurality of openings that correspond to the conductive regions, respectively. (c) A conductive formation layer is made on the insulation layer with the openings, and the conductive layer is removed to leave a conductive member filling each opening. (d) An exterior conductive body is arranged on the conductive member, and the LED wafer is diced into a plurality of LED packages.

A method for producing an LED package includes the following steps. (a) An LED wafer is provided, which includes a plurality of LED sections. Each LED section includes a conductive region-forming surface and a plurality of conductive regions disposed on the conductive region-forming surface. (b) A first insulation layer is formed on the conductive region-forming surface of each LED section. (c) A metallic reflection layer is made on the first insulation layer, and patterned with a plurality of through holes to expose the first insulation layer. (d) The first insulation layer is patterned with a plurality of channels that communicate with the through holes, respectively, so as to expose the corresponding conductive regions. (e) A second insulation layer is formed on the metallic reflection layer, and patterned with a plurality of openings in accordance with the through holes and the channels, so as to expose the corresponding conductive regions. (f) A conductive formation layer is disposed on the second insulation layer, an exposed portion thereof that is higher than the second insulation layer is exposed, and a conductive member is left inside each opening for electrically connecting the corresponding pad. (g) An exterior conductive body, electrically connected to an exterior circuit and to each pad, is provided, and the LED wafer is diced into a plurality of LED packages.

A method for producing an LED package includes the following steps. (a) An LED die, including a conductive region-forming surface and a plurality of conductive regions disposed on the conductive region-forming surface, is provided. (b) A reflection layer is adhered to the LED die. The reflection layer is opposite the conductive region-forming surface. (c) A substrate is provided. The substrate has a die-installation surface to which the LED die is connected via the reflection layer. The substrate includes two connection members in accordance with the conductive regions for electrical connection, respectively, and each connection member extends from the die-installation surface to a predetermined portion of a back surface of the substrate, opposite the die-installation surface, for electrically connecting an exterior circuit. (c) A binding wire connects a respective pad and a corresponding connection member. (d) A protection layer covers the substrate for enclosing the LED die and the binding wire.

A method for producing an LED package includes the following steps. (a) An LED wafer is provided, which includes a plurality of LED sections. Each LED section includes a conductive region-forming surface and a plurality of conductive regions disposed on the conductive region-forming surface. (b) A first insulation layer is installed on the conductive region-forming surface of each LED section. (c) A metallic reflection layer is formed on the first insulation layer. (d) A second insulation layer is formed on the metallic reflection layer, and the second insulation layer is patterned with a plurality of openings so as to expose the metallic reflection layer. (e) The metallic reflection layer is patterned with a plurality of through holes in order to expose the first insulation layer. (f) The first insulation layer is patterned with a plurality of channels that communicate with the through holes, respectively, so as to communicate with the through holes. (g) A third insulation layer is formed on the second insulation layer besides the openings, and the third insulation layer is patterned with a plurality of penetrating holes in accordance with the openings, the through holes and the channels, in order to expose the corresponding conductive regions, respectively. (h) A conductive formation layer is disposed on the third insulation layer, an exposed portion thereof that is higher than the third insulation layer is removed, and a conductive member is left inside each penetrating hole for electrically connected the corresponding conductive region. (i) An exterior conductive body, electrically connected to an exterior circuit and to each conductive region, is provided, and the LED wafer is diced into a plurality of LED packages.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

FIG. 24 is a side view of a reflection layer of a conventional LED package;

FIG. 25 is a side view of a reflection layer of another conventional LED package.

DETAILED DESCRIPTION OF THE EMBODIMENTS

Figure 1:
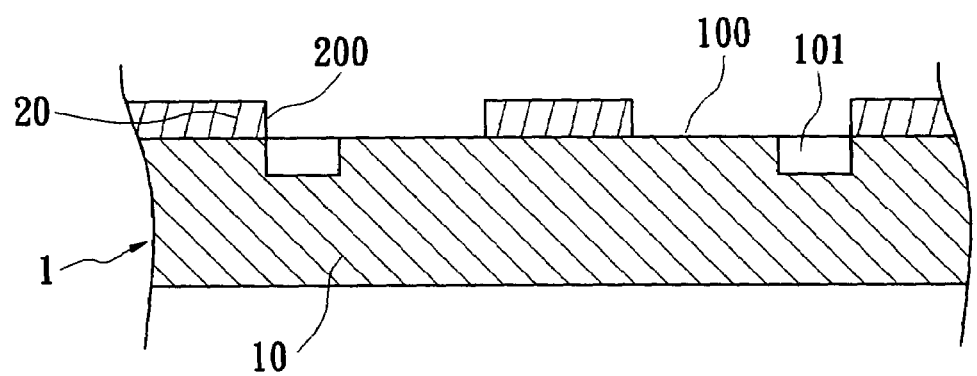
FIGS. 1 to 4 are cross-sectional profiles of a first embodiment of an LED package according to the present invention.

A first embodiment of an LED package of the present invention is illustrated in FIGS. 1 to 4. An LED wafer, partially shown in FIG. 1, is provided first. The LED wafer 1 includes a plurality of LED sections 10, and only one LED section 10 is shown. Each LED section 10 includes an LED die, and for ease of explanation, only one LED section 10 will be given as an example. Each LED section 10 includes a conductive region-forming surface 100 and at least two conductive regions 101 disposed on the conductive region-forming surface 100. Each conductive region 101 has disposed thereon a metallurgic layer (not shown) as a UBM (Under Bump metallurgy) in a proper manner. According to the first embodiment, a main light-emission surface on each LED section 10 is opposite the conductive region-forming surface 100.

A photosensitive insulation layer 20, which is composed of polyimide materials or the like, is formed on the conductive region-forming surface 100. The insulation layer 20 is patterned with a plurality of openings 200 corresponding to the conductive regions, respectively.

Figure 2:
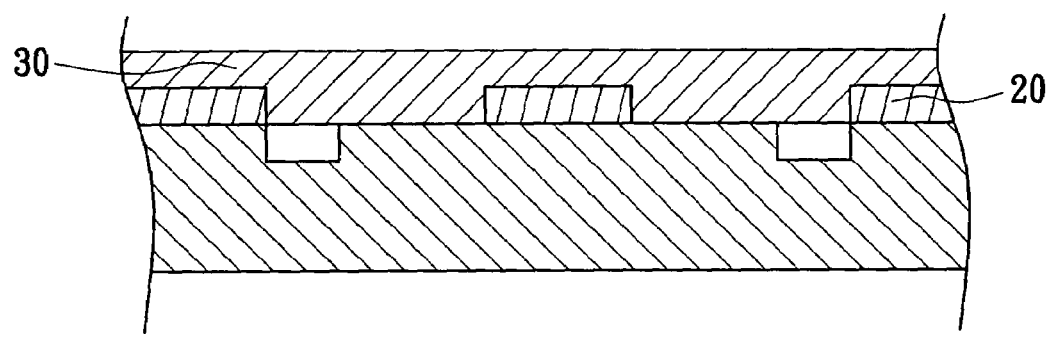
Figure 3:
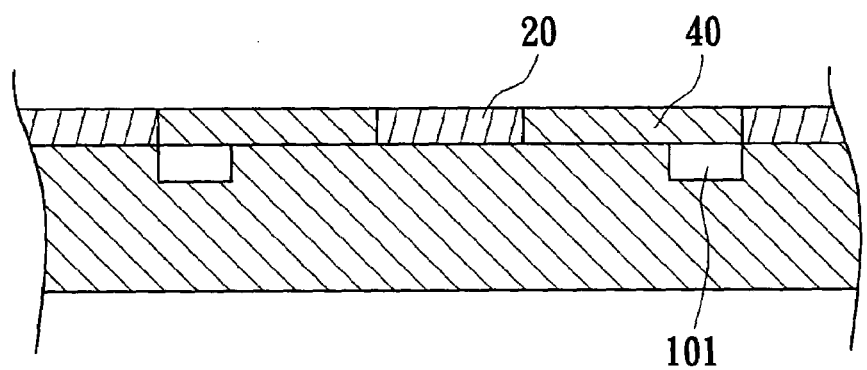

After the openings 200 are formed, a conductive formation layer 30, illustrated in FIGS. 2 and 3, is formed on a whole surface of the insulation layer 20 and reveals portions of the conductive region-forming surface 100 via the openings 200 by means of, for example, printing. The conductive formation layer 30 includes, for example, conductive adhesives or the like. Furthermore, the conductive formation layer 30 is ground so as to remove part of the conductive formation layer formed on the insulation layer 20, thereby leaving remaining of the conductive formation layer inside the openings 200 serve as conductive members 40 that connect corresponding conductive regions 101.

Figure 4:
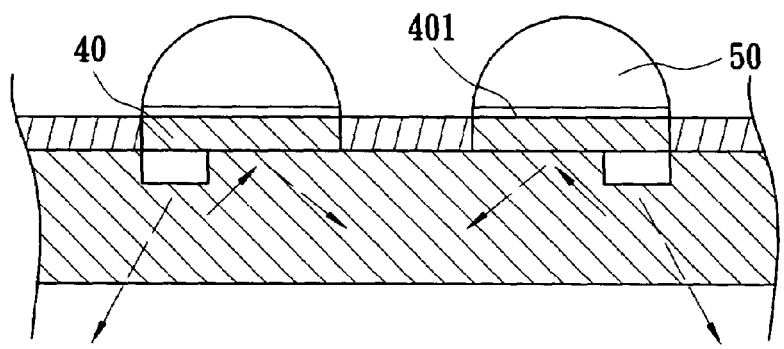

Over each conductive member 40 is disposed with a metallic layer 401 by any proper manner in FIG. 4. Each metallic layer 40 includes a nickel layer and a gold layer, or may be formed from other appropriate metallic materials. On each metallic layer 40 is disposed an exterior conductive body 50 used for electrically connecting an exterior circuit (not shown). Then, the LED wafer 1 is diced along a dicing line (not shown) into a plurality of LED packages.

There are some advantages in the first embodiment of the present invention:

1. A sheet of the LED wafer 1 is processed. That means a plurality of LED sections 10 are processed simultaneously and the manufacturing quantity is improved.

Figure 5:
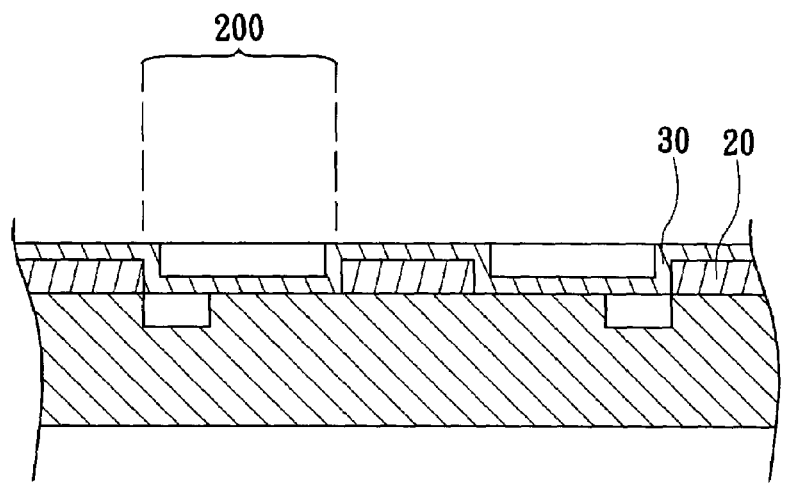
FIGS. 5 to 8 are cross-sectional profiles of a second embodiment of the LED package according to the present invention.

2. The conductive members 40 are formed by reflective and conductive material, so that they can be treated as reflection layers. Therefore, as shown in FIG. 4, the light toward the conductive members 40, as indicated by solid arrows, will be reflected and emitted through the main light-emission surface, as indicated by the dotted arrows. Thus, the illumination provided tby the LED package will be improved as compared with the prior art. A second embodiment of the LED package of the present invention is illustrated in FIGS. 5 to 8. An LED wafer, partially shown in FIG. 5, is similar to that shown in FIG. 1. After the openings 200 are formed, a conductive formation layer 30 is formed on the whole surface of the insulation layer 20 and the revealed portions of the conductive region-forming surface 100 via the openings 200 by means of, for example, sputtering. The conductive formation layer 30 can be made of appropriate materials by any other proper manners.

Figure 6:
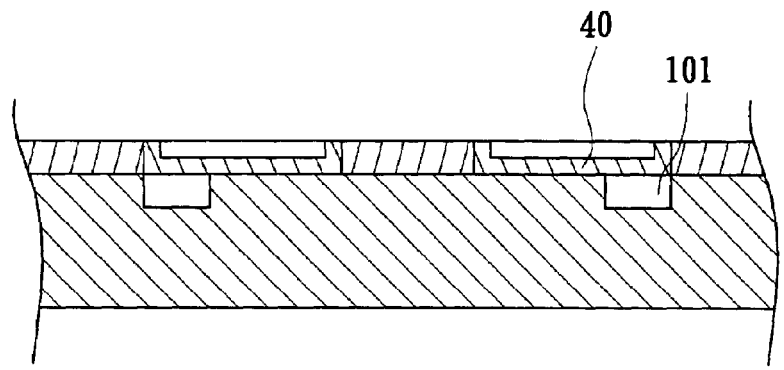

The conductive formation layer 30 is ground so as to remove part of the conductive formation layer 30 formed on the insulation layer 20, thereby leaving remaining of the conductive formation layer 30 inside the openings 200 to serve as conductive members 40 that connect corresponding conductive regions 101 (in FIG. 6).

Figure 7:
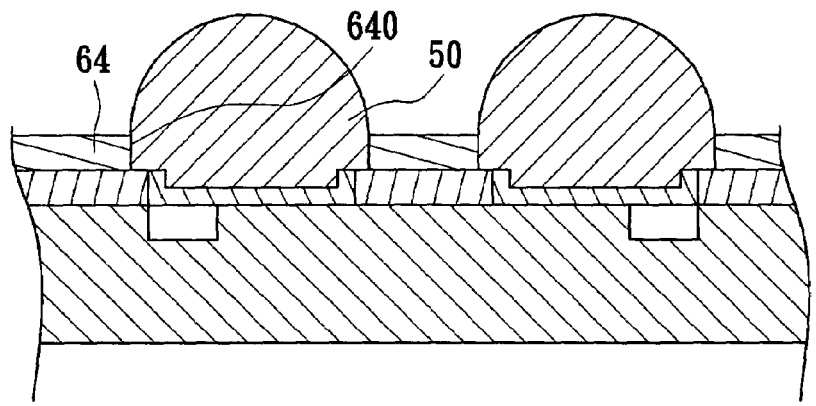

Referring to FIG. 7, an auxiliary layer 64 is formed on the whole surface of the insulation layer 20. The auxiliary layer 64 is further patterned so as to form a plurality of passageways 640 that communicate with corresponding openings 200. Each passageway 640 and the corresponding one of the openings 200 together form a conductive-body formation hole.

Inside each conductive-body formation hole, an exterior conductive body 50 is disposed in order to connect electrically the corresponding conductive member 40. The exterior conductive body 50 has an exposed portion exposed by the conductive-body formation hole. In a preferred embodiment, the exterior conductive body 50 can be a solder bump.

Figure 8:
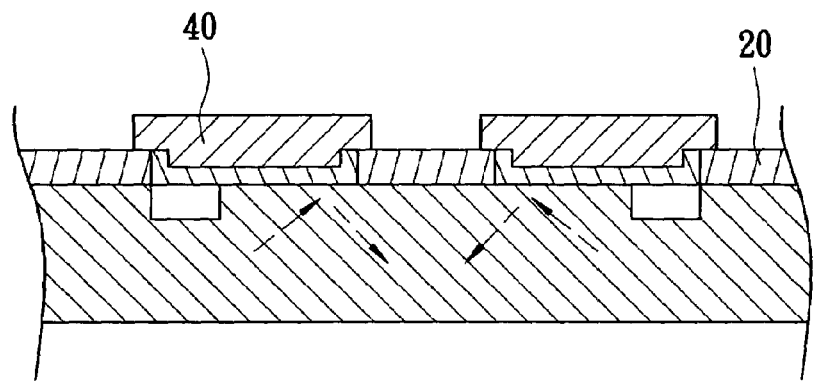
Figure 9:
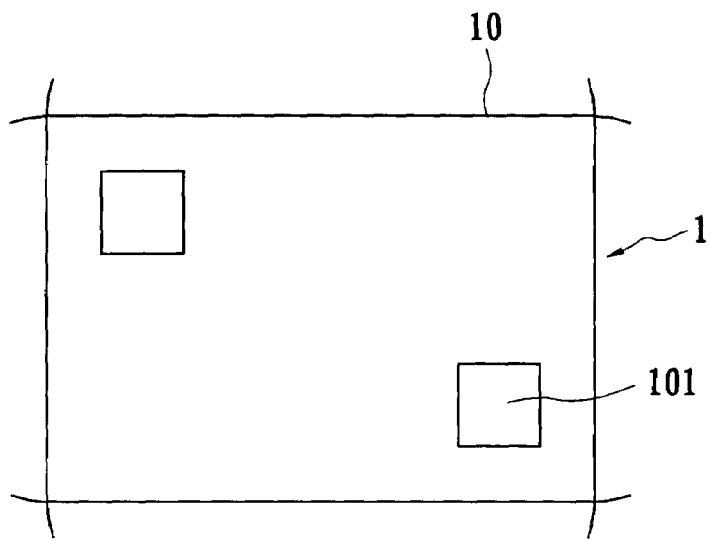
FIGS. 9 to 14 are cross-sectional profiles of a third embodiment of the LED package according to the present invention.
Figure 10:
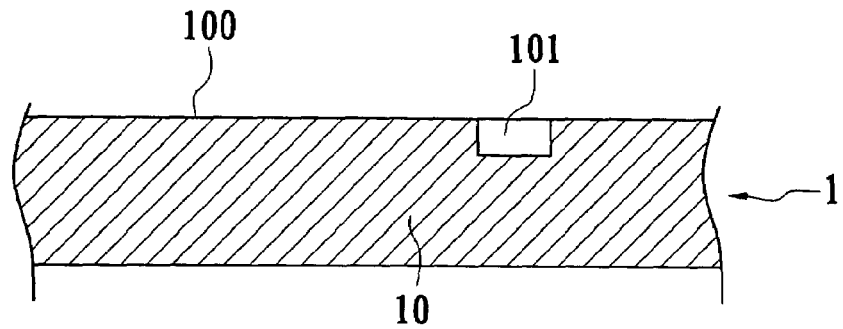

In FIG. 8, the exposed portion of the exterior conductive body 50 can be ground flat and the auxiliary layer 64 is then removed.

Finally, the LED wafer 1 can be diced along a dicing line (not shown) into a plurality of LED packages.

Advantages of the second embodiment are the same as those in the first embodiment.

A third embodiment of the LED package of the present invention is illustrated in FIGS. 9 to 14. An LED wafer is provided in FIGS. 9 and 10, and is similar to that shown in FIG. 1.

Figure 11:
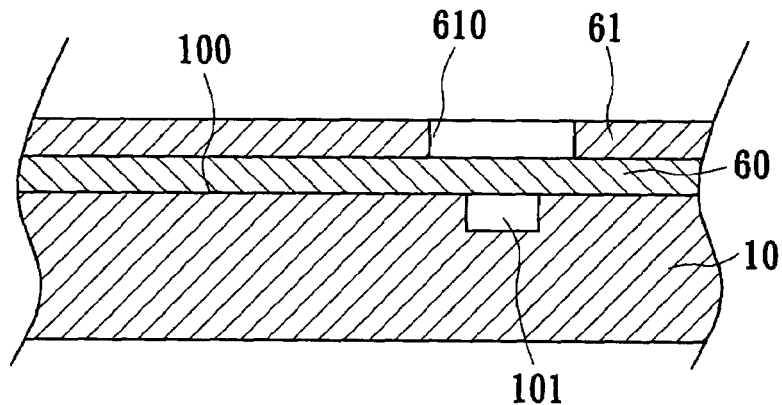

With respect to FIG. 11, a photosensitive and transparent first insulation layer 60, which is composed of polyimide materials or the like, is formed on the conductive region-forming surface 100.

A metallic reflection layer 61 is disposed on the first insulation layer 60. The metallic reflection layer 61 is a metallic thin film of high reflectivity. The metallic reflection layer 61 can be formed by coating metal material or by adhering a metal thin film on the first insulation layer 60. When the metallic reflection layer 61 is formed by coating metal material on the first insulation layer 60, the metallic refection layer 61 can be formed with a plurality of through holes 610 corresponding to the conductive regions 101 by appropriate chemical processes. When the metallic reflection layer 61 is formed by adhering a metal thin film on the first insulation layer 60 the through holes 610 are formed in the metal thin film before adhered on the first insulation layer 60, and thus, the chemical processes can be omitted. In this embodiment, the metallic reflection layer 61 is formed by adhering a metal thin film on the first insulation layer 60.

Figure 12:
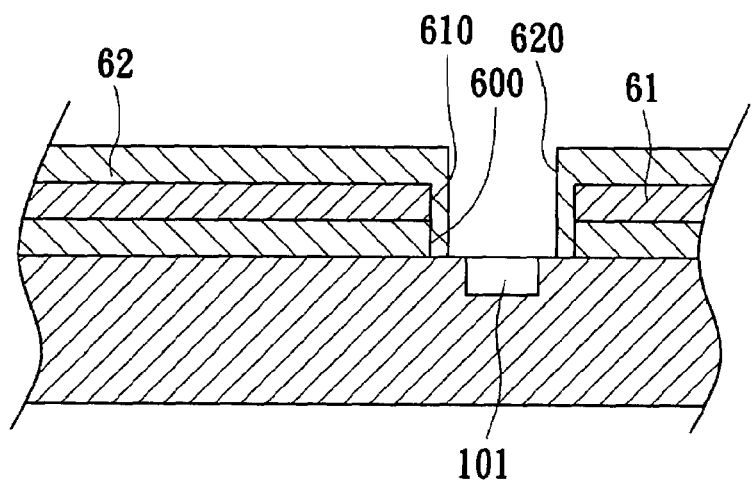

In FIG. 12, the first insulation layer 60 can be patterned to form a plurality of channels 600 each registered with a corresponding one of the through holes 610 by using the metallic reflection layer 61 as a mask. A second insulation layer 62 is formed on a whole surface of the metallic reflection layer 61 and is patterned to form a plurality of openings 620 each extending through a corresponding through hole 610 and a corresponding channel 600 registered with the corresponding through hole 610 and reaching a corresponding conductive region 101, such that the opening-confining wall of each of the opening 620 is transverse to a plane of the layer 61 to isolate the layer 61 from the corresponding conductive region 101 while permitting access to the corresponding conductive region 101.

Figure 13:
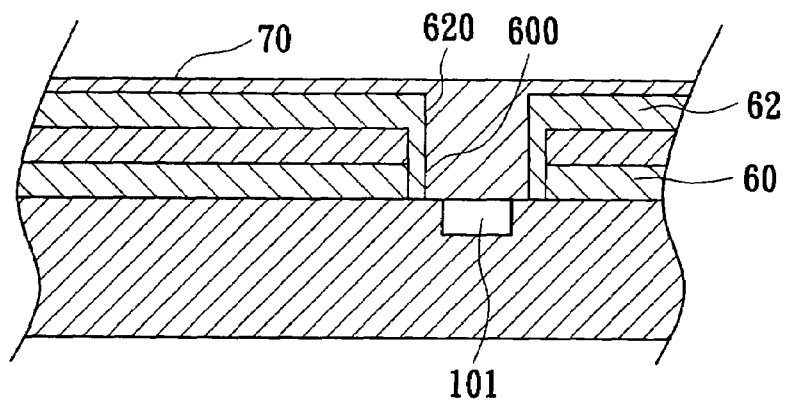
Figure 14:
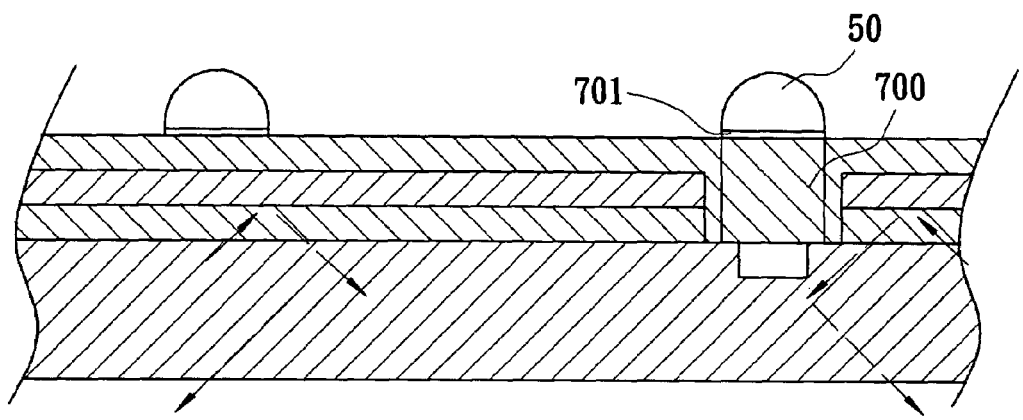

A conductive formation layer 70 can be formed on a whole surface of the second insulation layer 62 and the revealed portions of the conductive region-forming surface 100 via the openings 620 (in FIG. 13). The conductive formation layer 70 can be ground so as to remove part of the conductive formation layer 70 formed on the insulation layer 20, thereby leaving remaining of the conductive formation layer 70 inside the openings 600 to serve as conductive members 700 that connect corresponding conductive regions 101

As in the first embodiment, on each of the conductive members 700 is sequentially disposed a metallic layer 701 and an exterior conductive body 50. The LED wafer 1 can be diced along a dicing line (not shown) into a plurality of LED packages.

The advantages of the third embodiment are the same as those in the first embodiment.

Figure 15:
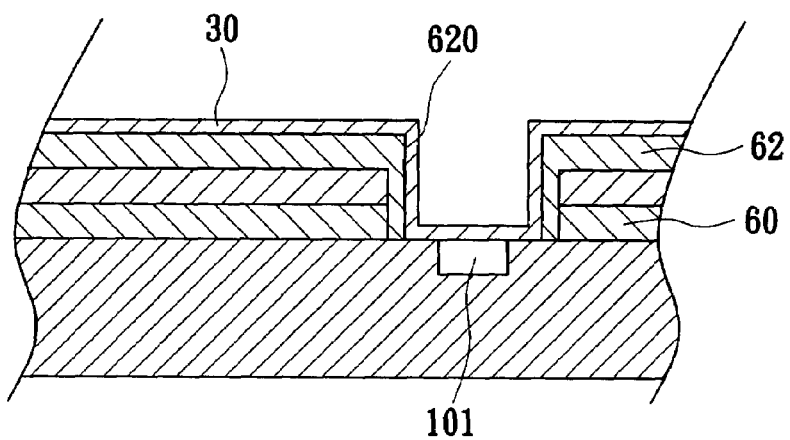
FIGS. 15 and 16 are cross-sectional profiles of a fourth embodiment the an LED package according to the present invention.
Figure 16:
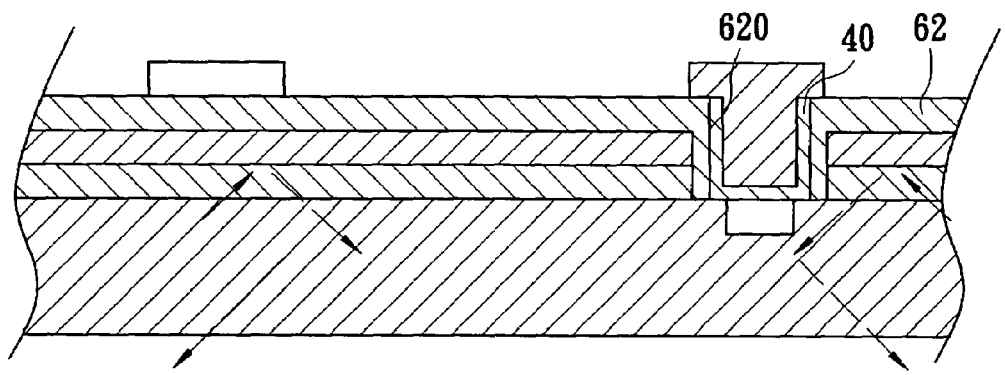

FIGS. 15 and 16 show the method for the LED package according to a fourth embodiment of the present invention. Unlike the third embodiment, after the opening 620 is formed, a conductive formation layer 30 is formed on the whole surface of the second insulation layer 62 and the revealed portions of the conductive region-forming surface 100 by means of, for example, sputtering (in FIG. 15).

Then, the conductive formation layer 30 is ground so as to remove part of the conductive formation layer 30 formed on the second insulation layer 62, thereby leaving remaining of the conductive formation layer 30 inside the openings 620 to serve as conductive members 40 that connect corresponding conductive regions 101

The exterior conductive body 50 can be formed in steps similar to those of the second embodiment. Finally, the LED wafer 1 is diced along a dicing line (not shown) into a plurality of LED packages.

Figure 17:
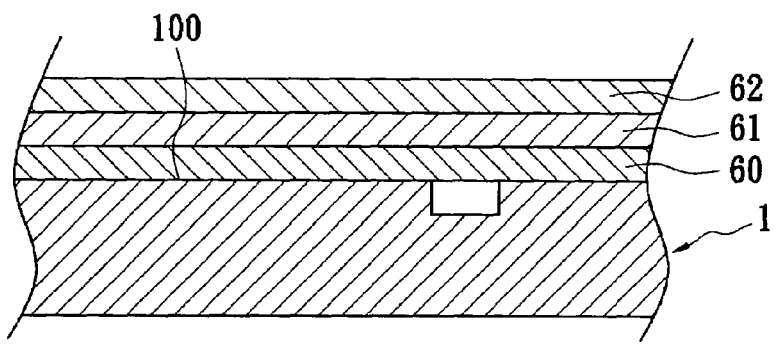
FIGS. 17 to 21 are cross-sectional profiles of a fifth embodiment of the LED package according to the present invention.

FIGS. 17 to 21 show the method for the LED package according to a fifth embodiment. As shown in FIG. 17, an LED wafer 1 similar to that of the third embodiment is provided.

A photosensitive and transparent first insulation layer 60, a metallic reflection layer 61 formed from a metallic thin film having high reflectivity, and a photosensitive second insulation layer 62 are sequentially formed on the conductive region-forming surface 100.

Figure 18:
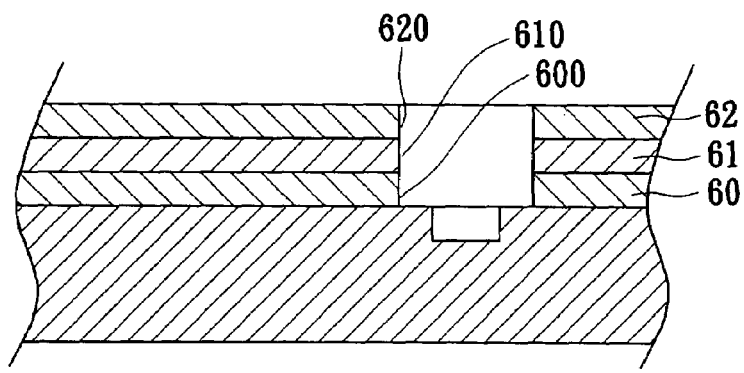

Referring to FIG. 18, the second insulation layer 62 is patterned to form a plurality of openings 620 for exposing portions of the metallic reflection layer 61 registered with the corresponding conductive regions 101.

After the openings 620 are formed, by the use of chemical processes, the metallic reflection layer 61 is processed to form a plurality of through holes 610 each registered with a corresponding one of the openings 620.

Subsequently, the first insulation layer 60 is patterned to form a plurality of channels 600 each registered with a corresponding one of the openings 620 and exposing a corresponding one of the conductive regions while using the second insulation layer 62 and the metallic reflection layer 61 as masks.

Figure 19:
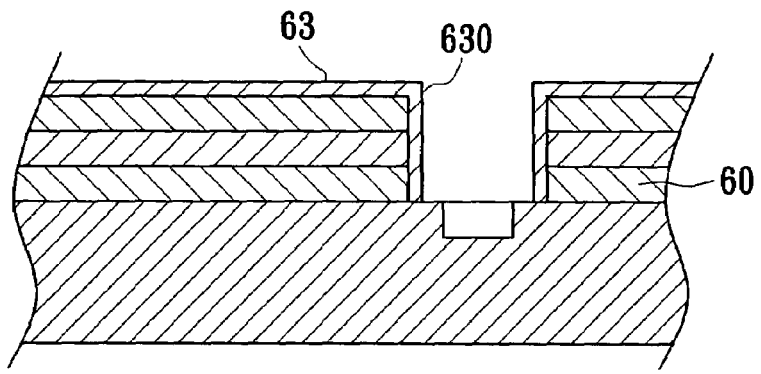

As shown in FIG. 19, a third insulation layer 63 is formed on a whole surface of the second insulation layer 62 and the revealed portion of the conductive region-forming surface via the openings 620. The third insulation layer 62 is patterned to form a plurality of penetrating holes 630 each extending through a corresponding opening 620, a corresponding through hole 610 and a corresponding channel 600 registered with the corresponding through hole 610 and reaching a corresponding conductive region 101, such that the opening-confining wall of each of the penetrating holes 630 is transverse to a plane of the layer 61 to isolate the layer 61 from the corresponding conductive region 101 while permitting access to the corresponding conductive region 101

It should be noted that, in this embodiment, the second and third insulation layer 620 and 630 cooperatively serving as the second insulation layer 620 in the third and fourth embodiments.

Figure 20:
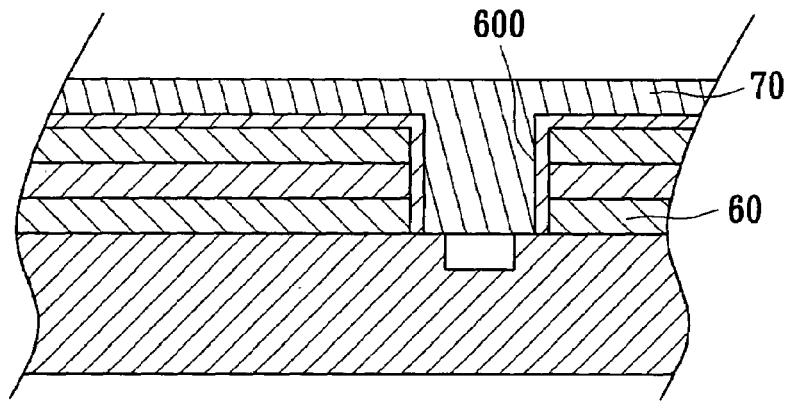

After the penetrating hole 630 is formed, a conductive formation layer 70 is formed on a whole surface of the third insulation layer 63 and revealed portions of the conductive region-forming surface 100, as shown in FIG. 20.

Figure 21:
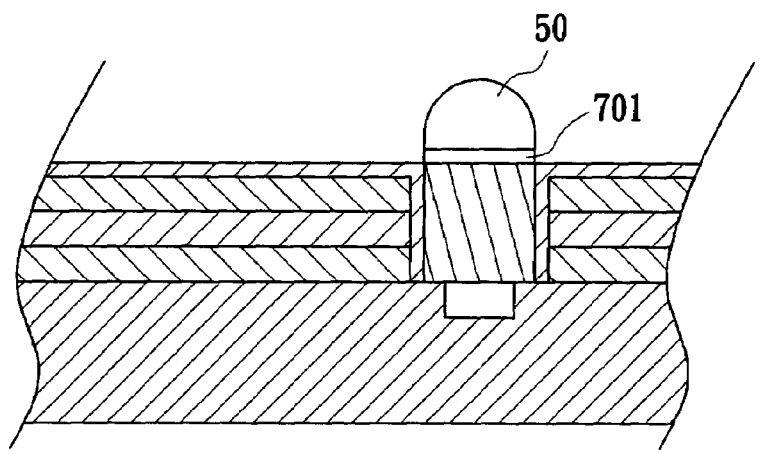

Referring to FIG. 21, the conductive formation layer 70 is ground so as to remove part of the conductive formation layer 70 formed on the third insulation layer 63, thereby leaving remaining of the conductive formation layer 70 inside the conductive-body formation holes each formed from one through hole 610, one channel 600, one opening 620 and one penetrating hole 630 that are registered one another, to serve as conductive members 40 that connect corresponding conductive regions 101

Then, on each of the conductive members 700 is disposed with the metallic layer 701 and the exterior conductive body 50 like those in the first embodiment. Finally, the LED wafer 1 is diced along a dicing line (not shown) into a plurality of LED packages.

Advantages of the third embodiment are the same as those in the first embodiment.

Figure 22:
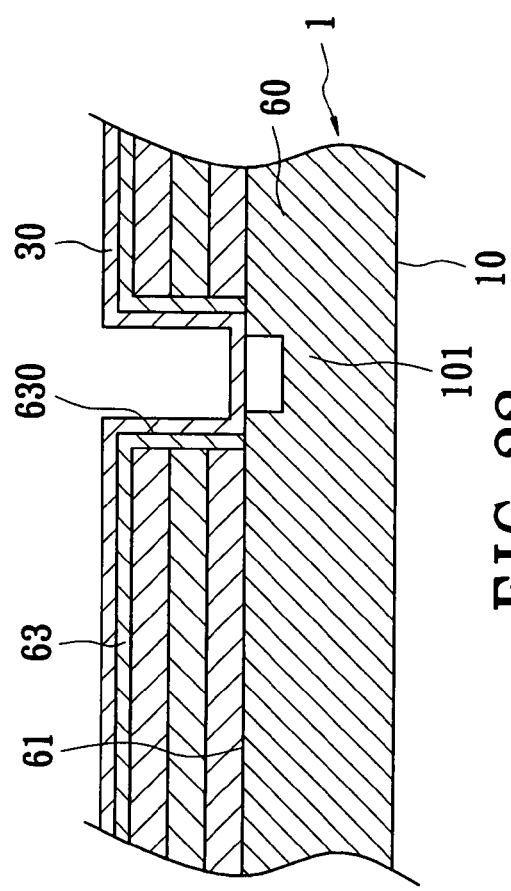
FIGS. 22 and 23 are cross-sectional profiles of a sixth embodiment of the LED package according to the present invention.
Figure 23:
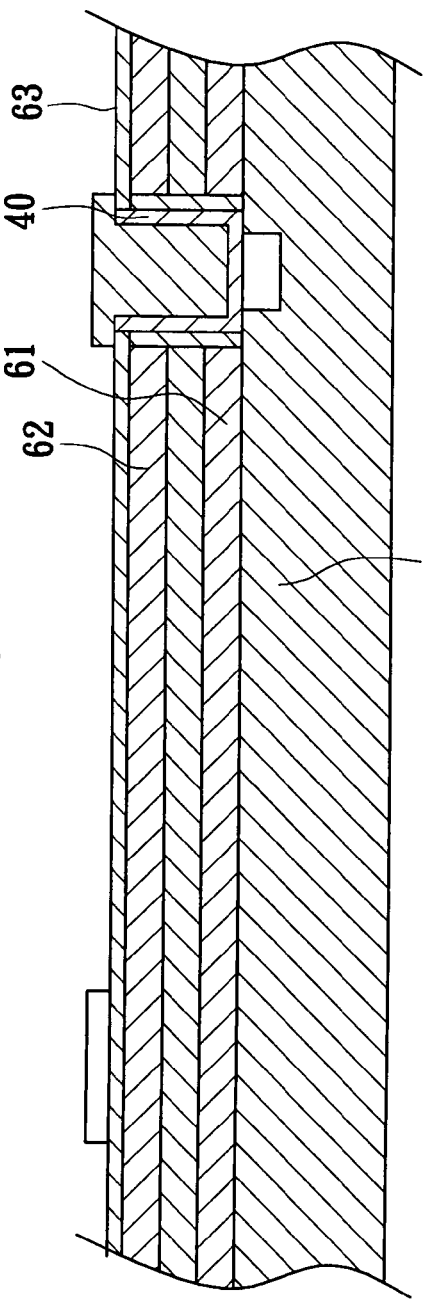

FIGS. 22 and 23 illustrate a sixth embodiment of the present invention. Unlike the fifth embodiment, after the penetrating hole 630 is formed in FIG. 22, a conductive formation layer 30 is formed on a whole surface of the third insulation layer 63 and the exposed portions of the conductive region-forming surface 100 by means of, for example, sputtering.

In FIG. 23, the conductive formation layer 30 is ground so as to remove part of the conductive formation layer 30 formed on the third insulation layer 63, thereby leaving remaining of the conductive formation layer 30 inside the penetrating holes 630 to serve as conductive members 40 that connect corresponding conductive regions 101.

After the formation of the conductive members 40, exterior conductive bodies 50 is formed in a similar manner as in the second embodiment, and the LED wafer 1 is diced along a dicing line (not shown) into a plurality of LED packages.

The advantages of the third embodiment are the same as those in the first embodiment.

Figure 26:
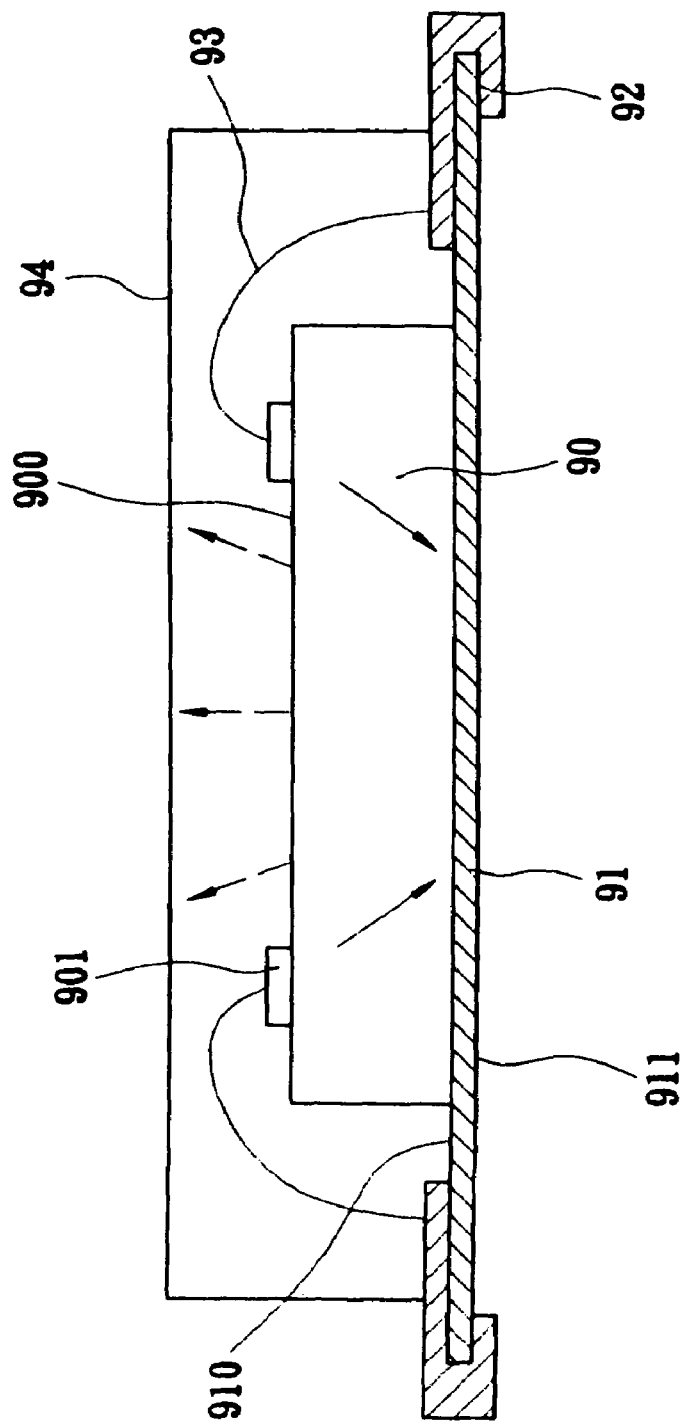
FIG. 26 is a cross-sectional profile of the conventional LED package.

FIG. 24 is a schematic side view showing the conventional LED package in FIG. 26 to which the metallic reflection layer in the present invention is applied. It should be noted that, a protection layer is removed, and some elements are partially exposed in FIG. 24.

The metallic reflection layer 61 is disposed between the substrate 91 and the conductive region-forming surface of the LED die 90 opposite to the conductive region-forming surface 900; thus the which is originally wasted is reflected and emitted through the main light emission surface 900, thereby increasing the illumination of the LED package.

FIG. 25 is a schematic side view showing the conventional LED package in FIG. 26 to which the metallic reflection layer in the present invention is applied. It should be noted that, a protection layer is removed, and some elements are partially exposed in FIG. 25.

In addition to the metallic reflection layer 61 disposed between the substrate 91 and the opposed surface of the LED die 90 opposite to the conductive region-forming surface 900, a metallic reflection layer 61 is also disposed on a side surface of the LED die 90, thus the light which is originally wasted is reflected and emitted through the main light emission surface 900, thereby increasing the illumination of the LED package.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An LED package, comprising:
    an LED die having a conductive region-forming surface and a plurality of conductive regions disposed on the conductive region-forming surface;
    a first insulation layer formed on the conductive region-forming surface of the LED die, and having a plurality of channels corresponding to the conductive regions, respectively;
    a metallic reflection layer formed on the first insulation layer, and having a plurality of through holes corresponding the channels, respectively;
    a second insulation later formed on the metallic reflection layer, and having a plurality of openings corresponding to the conductive regions via the channels and the through holes, respectively; and
    a conductive member filling a respective one of the openings, and electrically connected a respective one of the conductive regions to an exterior circuit.

2. The LED package as claimed in claim 1, wherein the conductive member is made of conductive adhesives.

3. The LED package as claimed in claim 2, further including a metallic layer formed on the conductive member.

4. The LED package as claimed in claim 3, further including an exterior conductive body disposed on the metallic layer.

5. The LED package as claimed in claim 4, wherein the metallic layer includes a nickel layer and a gold layer.

6. The LED package as claimed in claim 1, further including a metallurgic layer formed on a respective one of the conductive regions.

7. The LED package as claimed in claim 1, wherein the conductive member is made of metallic material by a sputtering process.

8. The LED package as claimed in claim 7, further including an exterior conductive body disposed on the conductive member.

9. The LED package as claimed in claim 8, wherein the exterior conductive body is a solder bump.

10. The LED package as claimed in claim 1, wherein each opening extends through a corresponding one of the through holes and a corresponding one of the channels registered therewith and reaching a corresponding one of conductive regions, such that an opening-confining wall of each of the openings is transverse to a plane of the metallic reflection layer to isolate the metallic reflection layer from the a corresponding one of the conductive regions, while permitting access to the corresponding one of the conductive regions.

* * * * *